(12) United States Patent
Yao et al.

(10) Patent No.: US 7,810,006 B2
(45) Date of Patent: Oct. 5, 2010

(54) TESTING SYSTEM FOR A DEVICE UNDER TEST

(75) Inventors: Cheng-Liang Yao, Kaohsiung (TW);
Ming-Tsung Hsia, Kaohsiung (TW)

(73) Assignee: Emerging Display Technologies Corp., Kaohsiung (TW)

( * ) Notice: Subject to any disclaimer, the term of this patent is extended or adjusted under 35 U.S.C. 154(b) by 359 days.

(21) Appl. No.: 12/013,592

(22) Filed: Jan. 14, 2008

(65) Prior Publication Data
US 2009/0183045 A1 Jul. 16, 2009

(51) Int. Cl.
*G01R 31/30* (2006.01)
(52) U.S. Cl. .................. 714/745; 714/25; 714/740; 714/742; 714/733; 714/712; 714/724; 324/755; 702/117; 702/124
(58) Field of Classification Search .................. None
See application file for complete search history.

(56) References Cited

U.S. PATENT DOCUMENTS

| | | | | | |
|---|---|---|---|---|---|
| 5,023,791 | A | * | 6/1991 | Herzberg et al. | 701/35 |
| 5,477,160 | A | * | 12/1995 | Love | 324/755 |
| 6,198,274 | B1 | * | 3/2001 | Onishi | 324/158.1 |
| 6,701,474 | B2 | * | 3/2004 | Cooke et al. | 714/724 |
| 2008/0189580 | A1 | * | 8/2008 | Kim et al. | 714/712 |

* cited by examiner

*Primary Examiner*—John P Trimmings
(74) *Attorney, Agent, or Firm*—Finnegan, Henderson, Farabow, Garrett & Dunner, L.L.P.

(57) ABSTRACT

A testing system for a device under test (DUT) includes a test parameter-generating device and a platform module. The test parameter-generating device stores test information, and is operable so as to execute a test algorithm, so as to generate a transmission signal upon execution of the test algorithm, and so as to generate a test environment with reference to the transmission signal. The platform module is operable so as to conduct testing of the DUT using the test information stored in the test parameter-generating device under the test environment generated by the test parameter-generating device.

9 Claims, 7 Drawing Sheets

TESTING SYSTEM FOR A DEVICE UNDER TEST

BACKGROUND OF THE INVENTION

1. Field of the Invention

This invention relates to a testing system, more particularly to a testing system for displays.

2. Description of the Related Art

In Taiwanese Patent No. 238314, there is disclosed a conventional testing system, as illustrated in FIG. 1, for different types of liquid crystal displays (LCDs) 94. The conventional testing system includes a computing unit 91, a signal generator 92, and a plurality of communications interfaces 93. The computing unit 91, such as a desktop computer, stores a test algorithm, and is operable so as to execute the test algorithm stored therein, so as to generate test patterns upon execution of the test algorithm, and so as to transmit the test patterns. The signal generator 92 is connected to the computing unit 91, stores a plurality of test programs, each of which is specific to a respective one of the LCDs 94, and is operable so as to select one of the test programs upon receipt of the test patterns transmitted by the computing unit 91. Each of the communications interfaces 93 is specific and connected to a respective one of the LCDs 94. The computing unit 91 is further operable so as to conduct testing of one of the LCDs 94 using the selected test program under a test environment.

The aforementioned conventional testing system is disadvantageous in that the test environment, such as a voltage source, is manually set by test personnel. As such, the conventional testing system is prone to error and is inefficient. Moreover, the conventional testing system requires the computing unit 91. As such, the conventional testing system is bulky, and thus lacks portability.

SUMMARY OF THE INVENTION

Therefore, the object of the present invention is to provide a testing system that can overcome the aforesaid drawbacks of the prior art.

According to the present invention, a testing system for a device under test (DUT) comprises a test parameter-generating device and a platform module. The test parameter-generating device includes a setting unit and a control unit. The setting unit stores test information, and is operable so as to transmit the test information stored therein, so as to execute a test algorithm, and so as to generate a transmission signal upon execution of the test algorithm. The control unit is coupled to the setting unit, and is operable so as to generate a test environment with reference to the transmission signal generated by the setting unit. The platform module is coupled to the test parameter-generating device, is adapted to be coupled to the DUT, and is operable so as to conduct testing of the DUT using the test information transmitted by the setting unit under the test environment generated by the control unit. The test algorithm is stored in one of the setting unit and the platform module.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
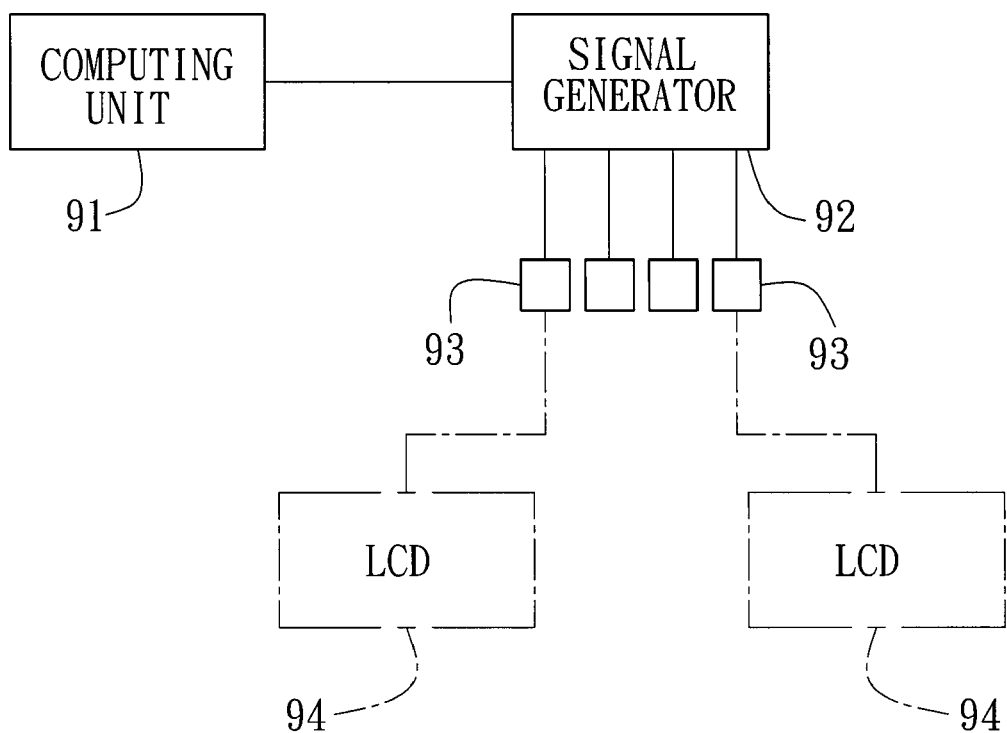
FIG. 1 is a schematic block diagram of a conventional testing system for liquid crystal displays (LCDs)

Before the present invention is described in greater detail, it should be noted that like elements are denoted by the same reference numerals throughout the disclosure.

Figure 2:
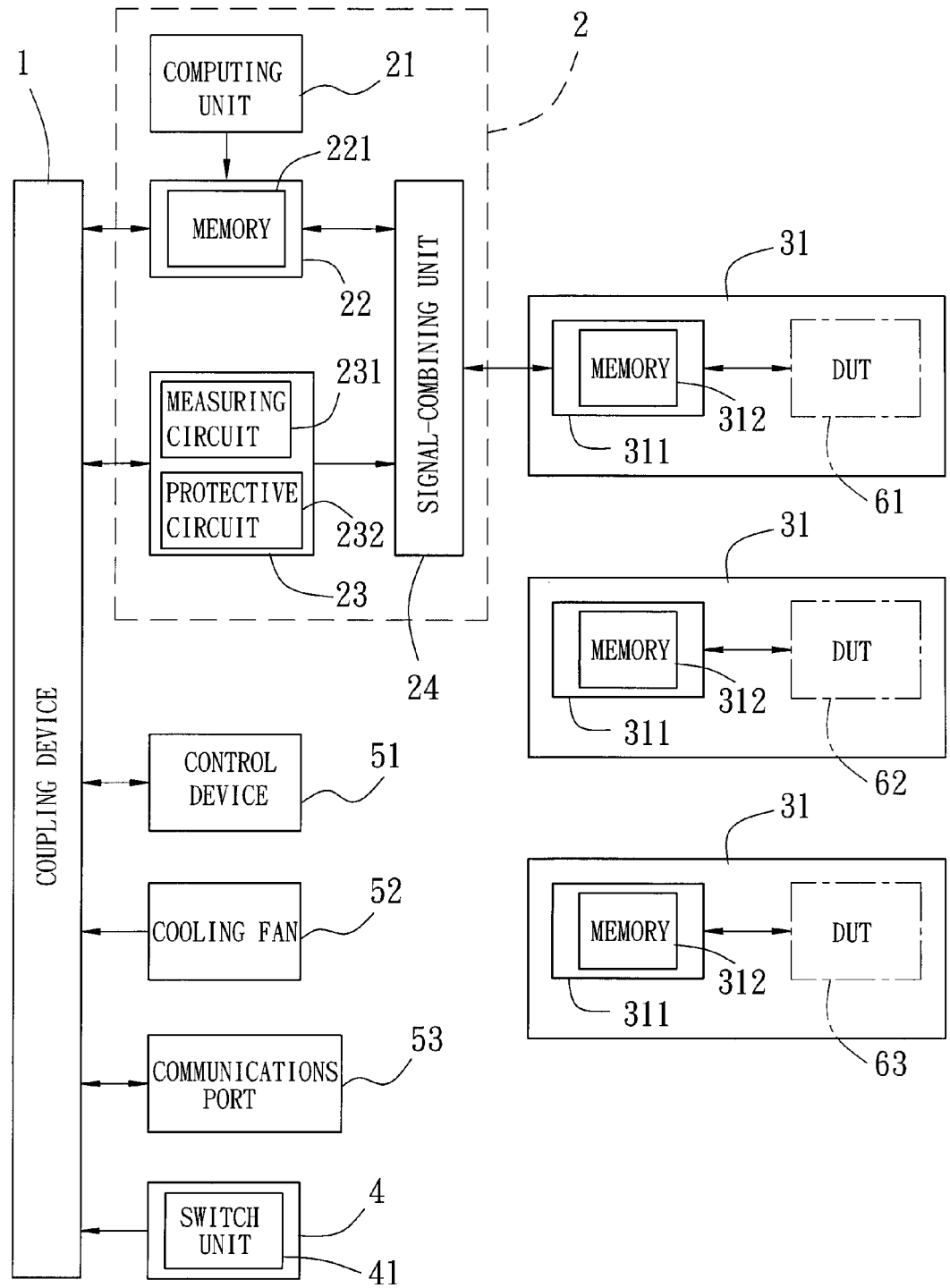
FIG. 2 is a schematic block diagram of the first preferred embodiment of a testing system for devices under test (DUTs) according to the present invention.

Referring to FIG. 2, the first preferred embodiment of a testing system for a plurality of devices under test (DUTs) 61, 62, 63 according to this invention is shown to include a test parameter-generating device 2 and a plurality of platform modules 31.

Each of the DUTs 61, 62, 63 in this embodiment is a display, such as a liquid crystal display (LCD) or an organic light-emitting display, and has a distinct specification.

The test parameter-generating device 2 includes a setting unit 22 and a control unit 23.

The setting unit 22 is implemented as a field programmable gate array (FPGA), and includes a memory 221 for storing test information and a test algorithm. The test information includes a plurality of test patterns, i.e., grey levels, color bars, and images. The test algorithm is specific to one of the DUTs 61, 62, 63, e.g., the DUT 61. In this embodiment, the setting unit 22 is operable so as to receive an input for selecting one of the test patterns of the test information stored in the memory 221 thereof, so as to transmit the selected test pattern of the test information, so as to execute the test algorithm stored in the memory 221 thereof, so as to generate a transmission signal upon execution of the test algorithm, and so as to transmit the transmission signal.

The control unit 23 is operable so as to generate a test environment with reference to the transmission signal transmitted by the setting unit 22. In this embodiment, the test environment includes a programmable power source.

The setting unit 22 is further operable so as to generate a control variable upon execution of the test algorithm, and so as to transmit the control variable.

The control unit 23 is further operable so as to generate voltage and current thresholds with reference to the control variable transmitted by the setting unit 22.

In this embodiment, the control unit 23 includes a measuring circuit 231 and a protective circuit 232. The measuring circuit 231 of the control unit 23 is operable so as to measure a voltage and a current of the programmable power source of the test environment generated by the control unit 23. The testing system further includes a control device 51 that is operable so as to monitor the voltage and the current measured by the measuring circuit 231 of the control unit 23. The protective circuit 232 of the control unit 23 transmits a warning signal when one of the voltage and the current monitored by the control device 51 exceeds a respective one of the voltage and current thresholds generated by the control unit 23.

The setting unit 22 is responsive to the warning signal transmitted by the protective circuit 232 of the control unit 23 so as to reset the control unit 23 and so as to stop transmitting the selected test pattern of the test information.

The test parameter-generating device 2 further includes a signal-combining unit 24 that is connected to the setting unit 22 and the control unit 23, and that is operable so as to combine the test environment and the voltage and current thresholds into a single signal.

Each of the platform modules 31 is specific to a respective one of the DUTs 61, 62, 63.

Since the platform modules 31 are identical in operation, only the platform module 31 specific to the DUT 61 will be described herein.

The platform module 31 includes an electrical adapter 311, which has a communications interface (not shown) connected to the DUT 61. In this embodiment, the platform module 31 is operable so as to conduct testing of the DUT 61 using the selected test pattern of the test information transmitted by the setting unit 22 under the test environment generated by the control unit 23.

The platform module 31 further includes a memory 312 for storing the test environment and the voltage and current thresholds in the single signal generated by the signal-combining unit 24.

The test parameter-generating device 2 further includes a computing unit 21, such as a desktop computer, that is connected to the setting unit 22, that stores a plurality of the test algorithms, each of which is specific to a respective one of the DUTs 61, 62, 63, and that is operable so as to store the test information and the test algorithms into the memory 221 of the setting unit 22.

In an alternative embodiment, the computing unit 21 is operable so as to store the test algorithm into the memory 312 of the platform module 31, instead of the memory 221 of the setting unit 22. Moreover, the setting unit 22 is further operable so as to store the test algorithm stored in the memory 312 of the platform module 31 into the memory 221 of the setting unit 22.

It is noted that the computing unit 21 may be dispensed with, and the test information and the test algorithm may be directly stored into the memory 221 of the setting unit 22 to thereby improve portability of the testing system of this invention.

The testing system further includes a coupling device 1, a reference voltage-providing device 4, a cooling fan 52, and a communications port 53.

The setting unit 22 and the control unit 23 of the test parameter-generating device 2 and the control device 51 are connected to the coupling device 1.

The setting unit 22 transmits the selected test pattern of the test information, the transmission signal, and the control variable to the control unit 23 through the coupling device 1.

The reference voltage-providing device 4 is connected to the coupling device 1, and is operable so as to provide a set of reference voltages. In this embodiment, the reference voltage-providing device 4 includes a switch unit 41 that is operable so as to set the reference voltages thereof.

The control unit 23 generates the test environment with further reference to the reference voltages provided by the reference voltage-providing device 4.

The cooling fan 52 is connected to the coupling device 1, and is operable so as to maintain the testing system within an operating temperature range, in a manner well known in the art.

The communications port 53 is connected to the coupling device 1 for connecting the testing system to an external device (not shown).

Figure 3:
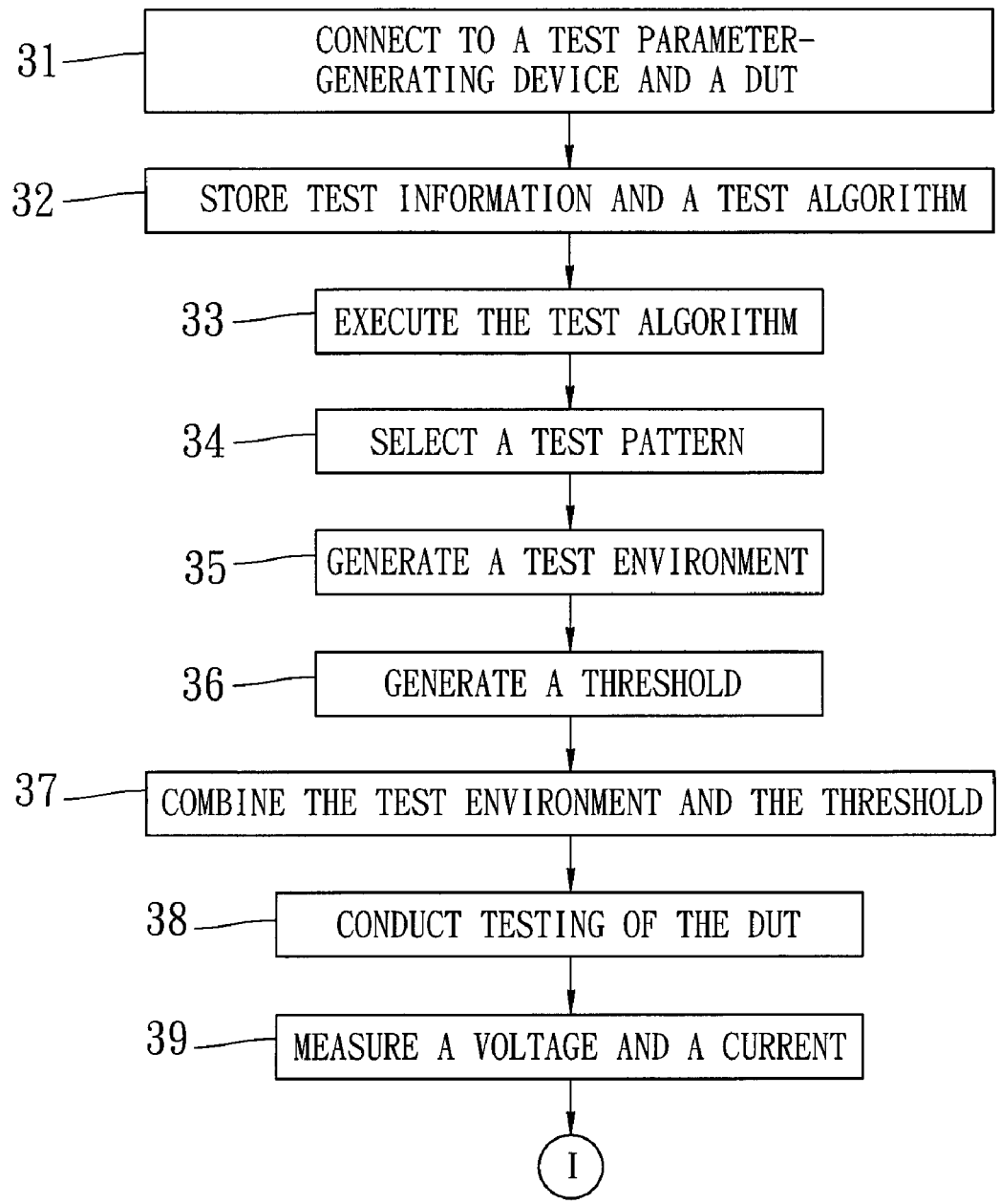
FIGS. 3 and 4 are flowcharts to illustrate the first preferred embodiment of a testing method for devices under test (DUTs) using the testing system shown in FIG. 2 according to the present invention.
Figure 4:
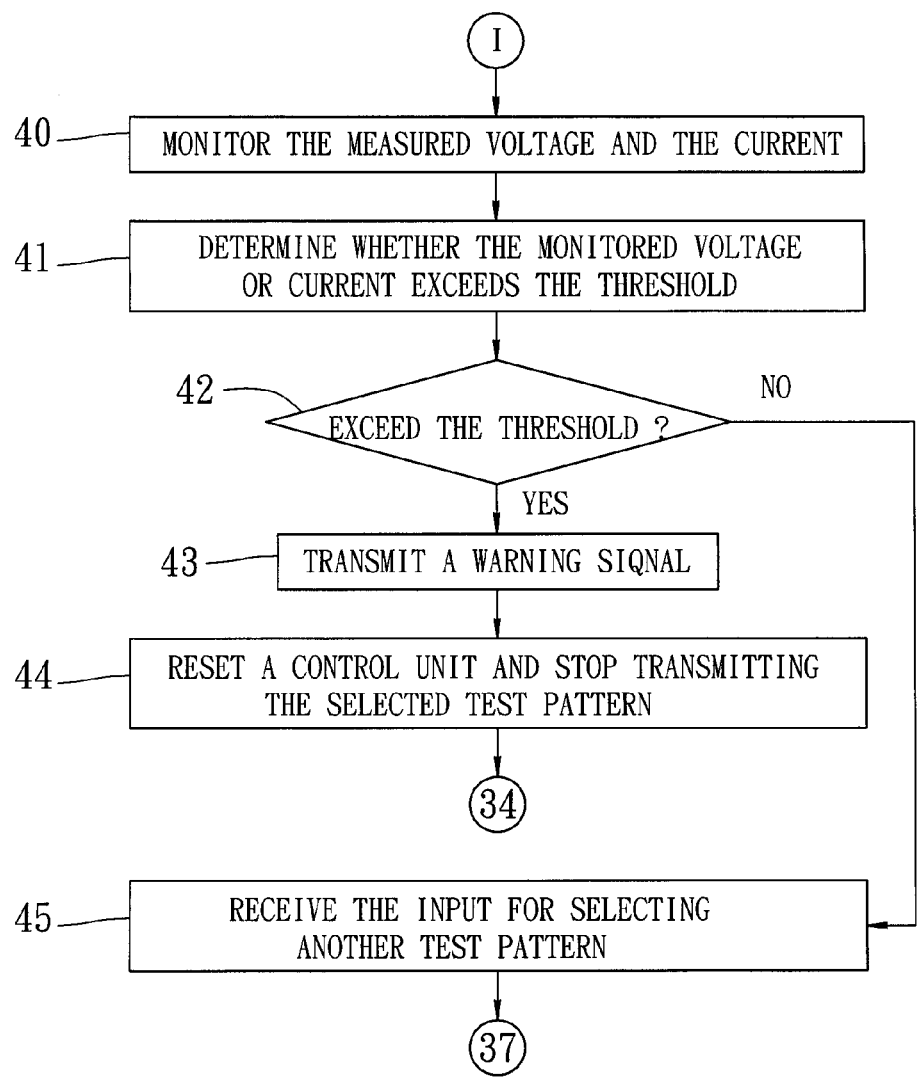

The first preferred embodiment of a testing method for the DUT 61 to be implemented using the first preferred embodiment of the testing system according to this invention will now be described with further reference to FIGS. 3 and 4.

In step 31, the platform module 31 is connected to the signal-combining unit 24 of the test parameter-generating device 2, and the communications interface (not shown) of the electrical adapter 311 thereof is connected to the DUT 61.

In step 32, the computing unit 21 stores test information, and a test algorithm specific to the DUT 61 into the memory 221 of the setting unit 22.

In step 33, the setting unit 22 executes the test algorithm to generate a transmission signal and a control variable, and transmits the transmission signal and the control variable.

In step 34, the setting unit 22 receives an input for selecting one of the test patterns of the test information, and transmits the selected test pattern of the test information.

In step 35, the control unit 23 generates a test environment with reference to the transmission signal transmitted in step 33 and the reference voltages provided by the reference voltage-providing device 4.

In step 36, the control unit 23 generates voltage and current thresholds with reference to the control variable transmitted in step 33.

In step 37, the signal-combining unit 24 combines the test environment generated in step 35 and the voltage and current thresholds generated in step 36 into a single signal, and transmits the single signal generated thereby and the selected test pattern of the test information transmitted by the setting unit 22.

In step 38, the platform module 31 conducts testing of the DUT 61 using the selected test pattern of the test information transmitted in step 37 under the test environment in the single signal transmitted in step 37.

In step 39, the measuring circuit 231 of the control unit 23 measures the voltage and the current of the programmable power source of the test environment generated in step 35.

In step 40, the control device 51 monitors the voltage and the current measured in step 39.

In step 41, the control device 51 determines whether one of the voltage and the current monitored thereby exceeds a respective one of the voltage and current thresholds generated in step 36.

In step 42, if it is determined in step 41 that the voltage exceeds the voltage threshold or the current exceeds the current threshold, the flow proceeds to step 43. Otherwise, the flow proceeds to step 45.

In step 43, the protective circuit 232 of the control unit 23 transmits a warning signal to the setting unit 22.

In step 44, the setting unit 22, in response to the warning signal, resets the control unit 23 and stops transmitting the selected test pattern of the test information. Thereafter, the flow goes back to step 34.

In step 45, the setting unit 22 receives the input for selecting another one of the test patterns of the test information, and transmits the selected test pattern. Thereafter, the flow goes back to step 37.

When it is desired to test another DUT, which is of the same type as the DUT 61, after completing the test with the DUT 61, steps 32, 33, 35 and 36 may be skipped. It is noted, however, that when said another DUT is one of the DUTs 62, 63, the testing system is first turned off, and the entire steps are repeated.

From the above descriptions, the testing system of this invention, aside from steps 31, 32, and 34, conducts testing of the DUT 61 without intervention from test personnel. As such, the testing system of this invention is less prone to error and is more efficient compared to the prior art.

Figure 5:
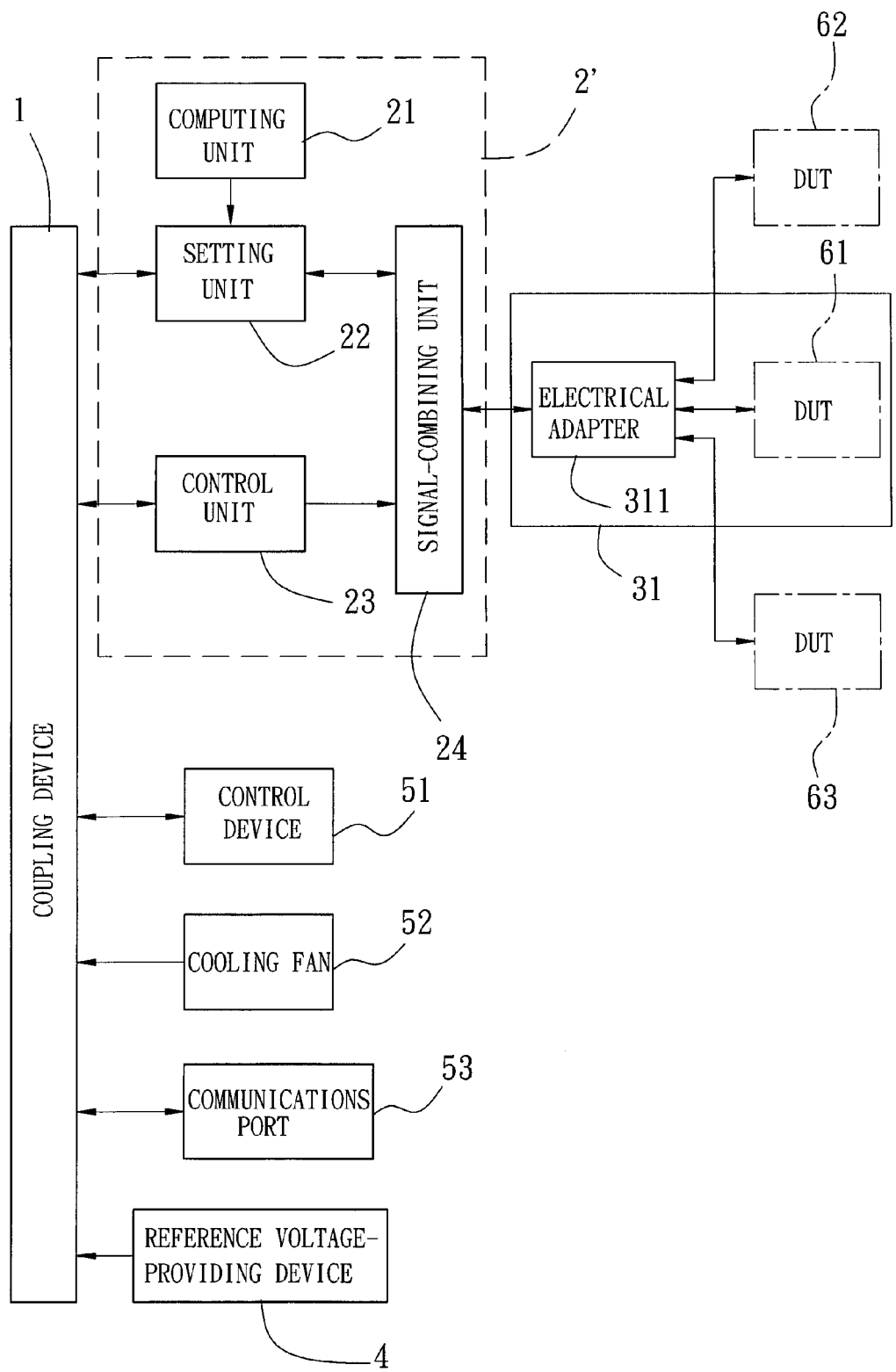
FIG. 5 is a schematic block diagram of the second preferred embodiment of a testing system for devices under test (DUTs) according to the present invention.

FIG. 5 illustrates the second preferred embodiment of a testing system for the DUTs 61, 62, 63 according to this invention. The testing system of this embodiment, like the previous embodiment, includes the test parameter-generating device 2, the platform module 31, the coupling device 1, the control device 51, the cooling fan 52, the communications port 53, and the reference voltage-providing device 4. However, the computing unit 21 of the test parameter-generating device 2 is operable so as to store one of the test algorithms thereof, which will be hereinafter referred to as the first test algorithm, into the memory 221 (see FIG. 2) of the setting unit 22, and another one of the test algorithms thereof, which will be hereinafter referred to as the second test algorithm, into the memory 312 (see FIG. 2) of the platform module 31.

The electrical adapter 311 of the platform module 31 includes a plurality of communications interfaces (not shown), each of which is specific and connected to a respective one of the DUTs 61, 62, 63.

The control unit 23 is further operable so as to generate a type of one of the DUT, e.g., the DUT 61, with reference to the control variable transmitted by the setting unit 22.

The signal-combining unit 24 further combines the type of the DUT generated by the control unit 23 into the single signal generated thereby.

The platform module 31 is further operable so as to select one of the communications interfaces (not shown) of the electrical adapter 311 thereof with reference to the type of the DUT in the single signal transmitted by the signal-combining unit 24, and so as to conduct testing of the DUT 61 connected to the selected communications interface of the electrical adapter 311 thereof.

Figure 6:
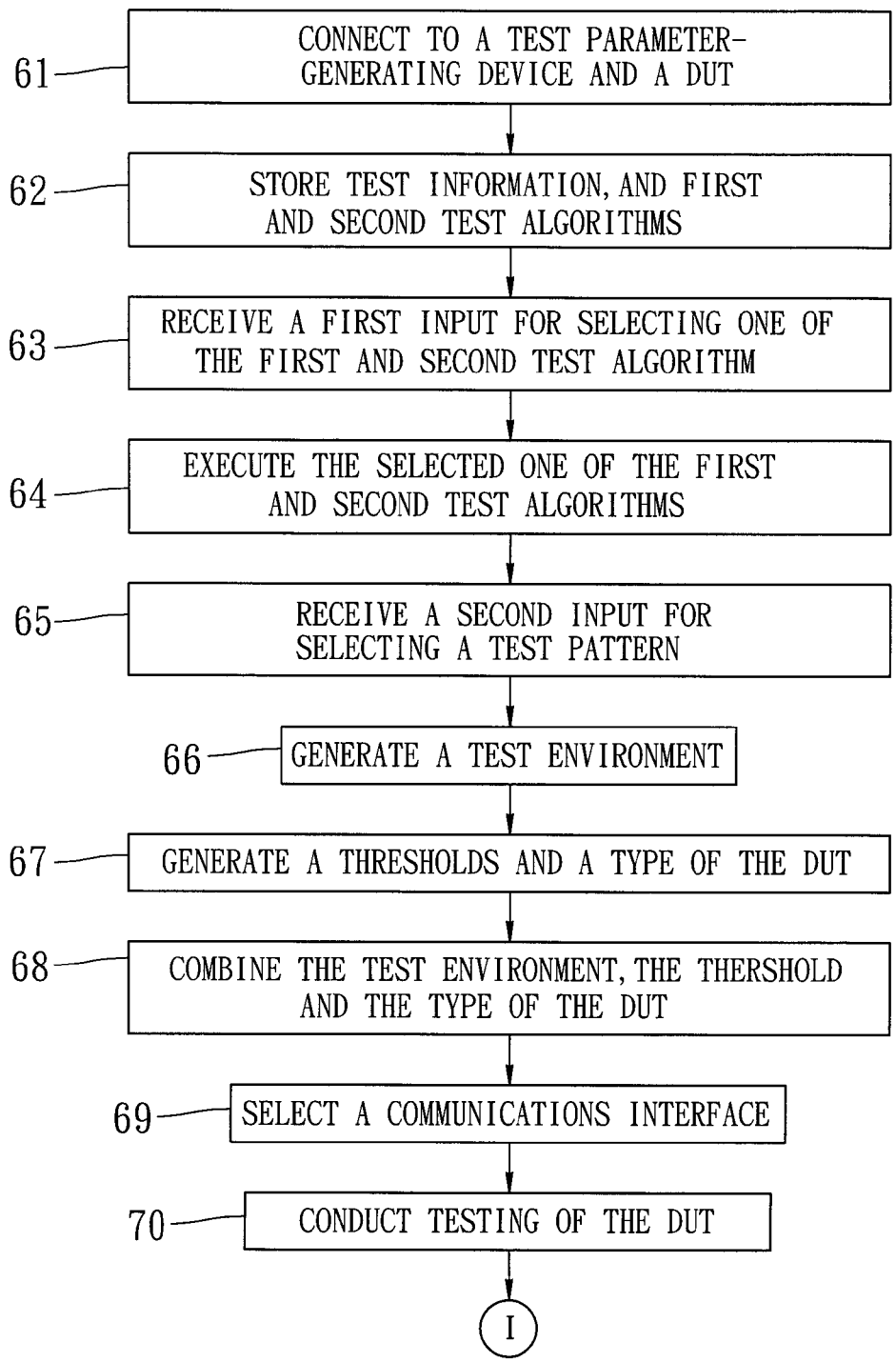
FIGS. 6 and 7 are flowcharts to illustrate the second preferred embodiment of a testing method for devices under test (DUTs) using the testing system shown in FIG. 5 according to the present invention.
Figure 7:
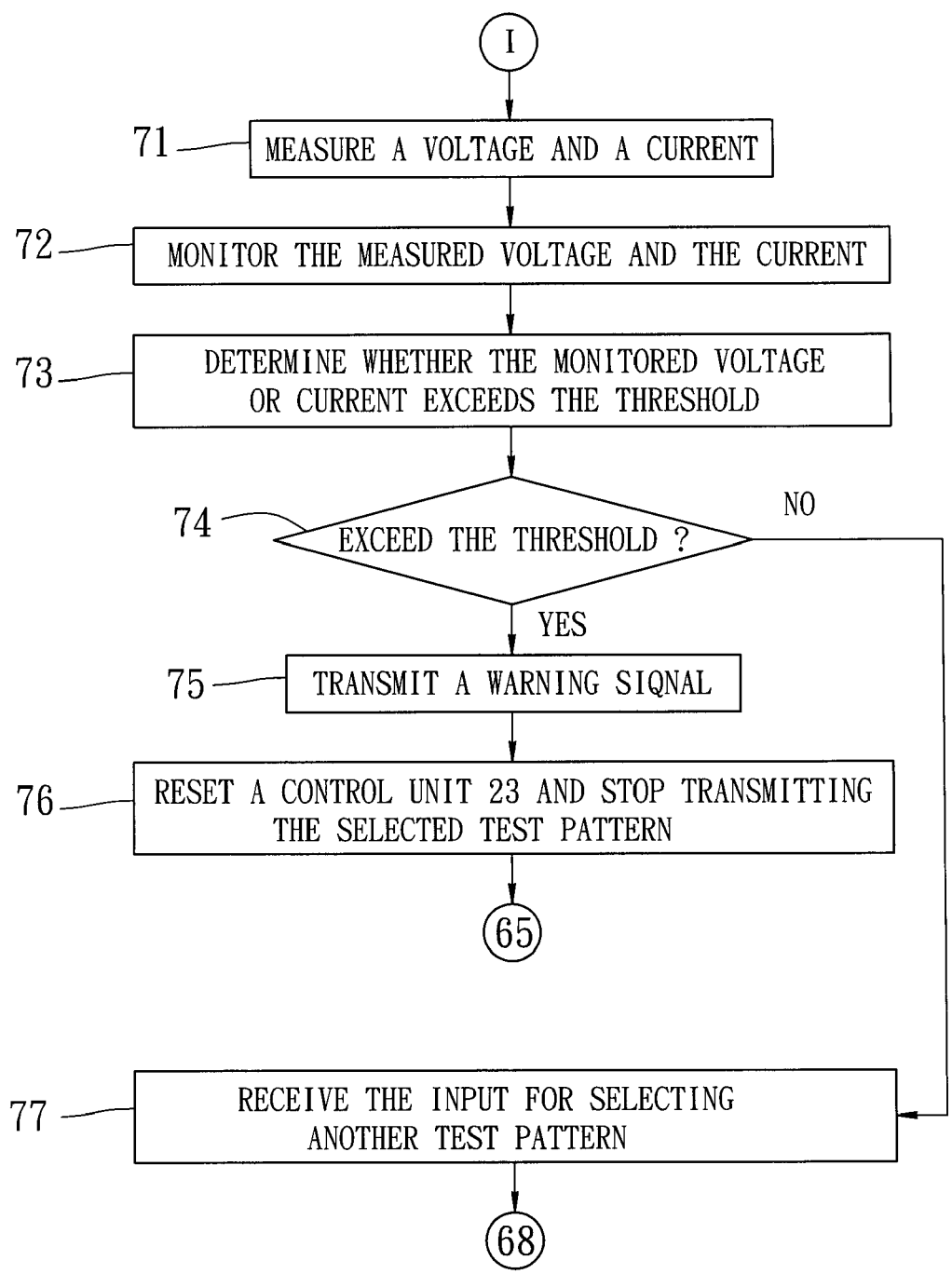

The second preferred embodiment of a testing method for the DUT 61 to be implemented using the second preferred embodiment of the testing system according to this invention will now be described with further reference to FIGS. 6 and 7.

In step 61, the platform module 31 is connected to the signal-combining unit 24 of the test parameter-generating device 2, and each of the communications interfaces of the electrical adapter 311 thereof is connected to a respective one of the DUTs 61, 62, 63. Thereafter, the testing system is turned on.

In step 62, the computing unit 21 stores the test information and a first test algorithm into the memory 221 of the setting unit 22, and a second test algorithm into the memory 312 of the platform module 31.

In step 63, the setting unit 22 receives a first input for selecting one of the first and second test algorithms.

In step 64, the setting unit 22 executes the selected one of the first and second test algorithms to generate a transmission signal and a control variable, and transmits the transmission signal and the control variable.

In step 65, the setting unit 22 receives a second input for selecting one of the test patterns of the test information, and transmits the selected test pattern of the test information.

In step 66, the control unit 23 generates a test environment with reference to the transmission signal transmitted in step 64 and the reference voltages provided by the reference voltage-providing device 4.

In step 67, the control unit 23 generates voltage and current thresholds and a type of the DUT, i.e., the DUT 61, with reference to the control variable transmitted in step 64.

In step 68, the signal-combining unit 24 combines the test environment generated in step 66 and the voltage and current thresholds and the type of the DUT generated in step 67 into a single signal, and transmits the single signal generated thereby and the selected test pattern of the test information transmitted by the setting unit 22.

In step 69, the platform module 31 selects one of the communications interfaces of the electrical adapter 311 thereof with reference to the type of the DUT in the single signal transmitted in step 68.

In step 70, the platform module 31 conducts testing of the DUT 61 connected to the selected communications interface of the electrical adapter 311 thereof using the selected test pattern of the test information transmitted in step 68 under the test environment in the single signal transmitted in step 68.

In step 71, the measuring circuit 231 of the control unit 23 measures the voltage and the current of the programmable power source of the test environment generated in step 66.

In step 72, the control device 51 monitors the voltage and the current measured in step 71.

In step 73, the control device 51 determines whether one of the voltage and the current monitored thereby exceeds a respective one of the voltage and current thresholds generated in step 67.

In step 74, if it is determined in step 73 that the voltage exceeds the voltage threshold or the current exceeds the current threshold, the flow proceeds to step 75. Otherwise, the flow proceeds to step 77.

In step 75, the protective circuit 232 of the control unit 23 transmits a warning signal to the setting unit 22.

In step 76, the setting unit 22, in response to the warning signal, resets the control unit 23 and stops transmitting the selected test pattern of the test information. Thereafter, the flow goes back to step 65.

In step 77, the setting unit 22 receives the second input for selecting another one of the test patterns of the test information, and transmits the selected test pattern of the test information. Thereafter, the flow goes back to step 68.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A testing system for a device under test (DUT), comprising:

a test parameter-generating device including a setting unit that stores test information, and that is operable so as to transmit the test information stored therein, so as to execute a test algorithm, and so as to generate a transmission signal upon execution of the test algorithm, and a control unit that is coupled to said setting unit, and that is operable so as to generate a test environment with reference to the transmission signal generated by said setting unit; and a platform module coupled to said test parameter-generating device, adapted to be coupled to the DUT, and operable so as to conduct testing of the DUT using the test information transmitted by said setting unit under the test environment generated by said control unit;

wherein the test algorithm is stored in one of said setting unit and said platform module;

wherein the test environment includes a programmable power source;

wherein said control unit includes a measuring circuit for measuring a voltage and a current of the programmable power source of the test environment; and wherein said setting unit further generates a control variable upon execution of the test algorithm, said control unit being further operable so as to generate voltage and current thresholds with reference to the control variable generated by said setting unit, said control unit further including a protective circuit that transmits a warning signal when one of the voltage and the current of the programmable power source of the test environment measured by said measuring circuit exceeds a respective one of the voltage and current thresholds, and said setting unit is responsive to the warning signal transmitted by said protective circuit of said control unit so as to reset said control unit and so as to stop transmitting the test information.

2. The testing system as claimed in claim 1, further comprising a control device operable so as to monitor the voltage and the current measured by said measuring circuit of the control unit, and so as to determine whether one of the voltage and the current monitored thereby exceeds the respective one of the voltage and current thresholds.

3. The testing system as claimed in claim 1, wherein said setting unit is implemented as a field programmable gate array (FPGA).

4. The testing system as claimed in claim 1, further comprising a reference voltage-providing device coupled to said test parameter-generating device, and operable so as to provide a set of reference voltages, said control unit generating the test environment with further reference to the reference voltages provided by said reference voltage-providing device.

5. The testing system as claimed in claim 1, further comprising:
a coupling device coupled to said test parameter-generating device; and
a cooling fan coupled to said coupling device.

6. The testing system as claimed in claim 1, further comprising:
a coupling device coupled to said test parameter-generating device; and
a communications port coupled to said coupling device.

7. The testing system as claimed in claim 1, wherein said test parameter-generating device further includes a computing unit that is coupled to said setting unit, and that is operable so as to store the test algorithm in said one of said setting unit and platform module.

8. The testing system as claimed in claim 1, wherein said platform module includes an electrical adapter that has a plurality of communications interfaces, said control unit being further operable so as to generate a control variable, said control unit being further operable so as to generate a type of the DUT with reference to the control variable, said platform module being further operable so as to select one of said communications interfaces of said electrical adapter thereof with reference to the type of the DUT of the control variable generated by said control unit.

9. A testing system for a device under test (DUT), comprising:
a test parameter-generating device including
a setting unit that stores test information, and that is operable so as to transmit the test information stored therein, so as to execute a test algorithm, and so as to generate a transmission signal upon execution of the test algorithm, and
a control unit that is coupled to said setting unit, and that is operable so as to generate a test environment with reference to the transmission signal generated by said setting unit; and
a platform module coupled to said test parameter-generating device, adapted to be coupled to the DUT, and operable so as to conduct testing of the DUT using the test information transmitted by said setting unit under the test environment generated by said control unit;
wherein the test algorithm is stored in one of said setting unit and said platform module; and
wherein said platform module includes an electrical adapter that has a plurality of communications interfaces, said control unit being further operable so as to generate a control variable, said control unit being further operable so as to generate a type of the DUT with reference to the control variable, said platform module being further operable so as to select one of said communications interfaces of said electrical adapter thereof with reference to the type of the DUT of the control variable generated by said control unit.

* * * * *